United States Patent [19]

Jindo et al.

[11] Patent Number: 5,574,889
[45] Date of Patent: Nov. 12, 1996

[54] APPARATUS FOR SELECTING AND EVALUATING DESIGN BASED ON STORED INFORMATION

[75] Inventors: Tomio Jindo, Yokohama; Yoji Shimizu, Yokosuka, both of Japan

[73] Assignee: Nissan Motor Co., Ltd., Yokohama, Japan

[21] Appl. No.: 186,894

[22] Filed: Jan. 27, 1994

Related U.S. Application Data

[63] Continuation of Ser. No. 627,283, Dec. 13, 1990, abandoned.

[30] Foreign Application Priority Data

Dec. 28, 1989 [JP] Japan ................. 1-338673

[51] Int. Cl.⁶ ............................................. G06F 17/50
[52] U.S. Cl. ................. 395/500; 364/551.01; 364/578; 364/581; 364/604
[58] Field of Search ..................... 364/512, 551.01, 364/581, 578, 604; 395/500

[56] References Cited

U.S. PATENT DOCUMENTS

| | | | |
|---|---|---|---|
| 4,228,421 | 10/1980 | Asada | 382/30 |
| 4,791,998 | 12/1988 | Hempkins et al. | 175/61 |
| 4,870,594 | 9/1989 | Ohkawara et al. | 364/474.24 |
| 4,989,166 | 1/1991 | Akasaka et al. | 364/578 |
| 4,991,176 | 2/1991 | Dahbura et al. | 371/27 |
| 5,070,458 | 12/1991 | Gilmore et al. | 364/424.06 |
| 5,269,325 | 12/1993 | Robinson et al. | 128/653.1 |

FOREIGN PATENT DOCUMENTS 2205184  11/1988  United Kingdom.

*Primary Examiner*—Ken S. Kim
*Attorney, Agent, or Firm*—Foley & Lardner

[57] ABSTRACT

The invention is a design evaluation apparatus for evaluating a design composed of a plurality of design elements. The apparatus has a database stored therein. The database contains design elements, evaluation terms and a table defining relations of the respective design elements with respect to each of the evaluation terms. At least one of the evaluation terms representative of the design is selected from the table, based upon the design elements of the design. The selected evaluation term is used to produce an evaluation result.

19 Claims, 14 Drawing Sheets

FIG. 2

| ITEM | DESIGN ELEMENT | METER | | | | | INSTRU-MENT & METER CLUSTER | | METER CLUSTER & CENTER CONSOLE | | DOOR | | CENTER CLUSTER | | ARM | SUM |
|---|---|---|---|---|---|---|---|---|---|---|---|---|---|---|---|---|
| | | A | B | C | D | E | F | G | H | I | J | K | L | M | N | |
| | coherent | 0.32 | *0.42 | 0.21 | (-0.25) | -0.45 | (*0.23) | -0.26 | (*0.26) | -0.34 | (*0.11) | -0.09 | (*0.19) | -0.06 | -0.03 | -0.68 |
| | incoherent | -0.32 | -0.42 | -0.21 | (0.25) | *0.45 | (-0.23) | *0.26 | (-0.26) | *0.34 | (-0.11) | *0.09 | (-0.19) | *0.06 | *0.03 | 0.68 |
| | (for speed mania) | -0.52 | -0.55 | -0.15 | (*0.56) | 0.46 | (*0.16) | -0.12 | (*0.15) | -0.23 | (*0.19) | -0.22 | (*0.16) | -0.08 | -0.23 | (6.52) |
| | suited for all | 0.52 | *0.55 | 0.15 | (-0.56) | -0.46 | (-0.16) | *0.12 | (-0.15) | *0.23 | (-0.19) | *0.22 | (-0.16) | *0.08 | *0.23 | -6.52 |
| | gorgeous | -0.78 | -0.36 | -0.09 | (0.13) | *0.51 | (-0.03) | *0.06 | (-0.06) | -0.03 | (-0.38) | -0.54 | (-0.13) | *0.21 | *0.19 | 3.11 |
| | simple | *0.78 | 0.36 | 0.09 | (-0.13) | -0.51 | (*0.03) | -0.06 | (*0.06) | *0.03 | (*0.38) | *0.54 | (*0.13) | -0.21 | -0.19 | -3.11 |
| | bright | -0.24 | -0.06 | -0.01 | (0.10) | -0.29 | (*0.13) | -0.08 | (*0.36) | -0.19 | (-0.08) | *0.16 | (-0.28) | *0.36 | *0.16 | 4.66 |
| | gloomy | *0.24 | 0.06 | 0.01 | (-0.10) | *0.29 | (-0.13) | *0.08 | (-0.36) | *0.19 | (*0.08) | -0.16 | (*0.28) | -0.36 | -0.16 | -4.66 |
| | extensive | 0.11 | *0.13 | -0.15 | (-0.03) | -0.06 | (*0.42) | -0.37 | (*0.39) | -0.26 | (-0.11) | *0.23 | (-0.59) | *0.56 | *0.12 | -2.46 |
| | cramped | -0.11 | -0.13 | *0.15 | (0.03) | 0.06 | (-0.42) | *0.37 | (-0.39) | *0.26 | (*0.11) | -0.23 | (*0.59) | -0.56 | -0.12 | 2.46 |

FIG.5

| Evaluation term | Factor 1 | Factor 2 | Factor 3 | Factor 4 | Factor 5 | Factor 6 | Factor 7 | Factor 8 | Factor 9 | Factor 10 |
|---|---|---|---|---|---|---|---|---|---|---|
| favorable-unfavorable | 0.99 | 0.11 | 0.06 | 0.20 | 0.07 | 0.10 | 0.05 | 0.10 | 0.03 | 0.02 |
| comfortable-uncomfortable | 0.92 | 0.05 | 0.12 | 0.16 | 0.06 | 0.08 | 0.04 | -0.05 | 0.10 | -0.09 |
| coherent-incoherent | 0.85 | -0.12 | 0.06 | -0.12 | 0.02 | -0.08 | 0.11 | 0.11 | 0.08 | 0.15 |
| good design-bad design | 0.83 | 0.24 | 0.16 | 0.03 | -0.06 | 0.05 | 0.06 | -0.07 | -0.01 | -0.06 |
| sporty-not sporty | 0.17 | 0.89 | -0.04 | -0.07 | -0.07 | 0.06 | 0.00 | 0.01 | -0.06 | 0.06 |
| for speed mania -for all | -0.14 | 0.80 | 0.02 | -0.18 | -0.20 | -0.09 | -0.01 | 0.07 | 0.04 | -0.04 |
| active-not active | 0.06 | 0.70 | -0.07 | -0.04 | 0.00 | 0.10 | 0.05 | 0.04 | -0.03 | -0.09 |
| high grade-popular | 0.26 | 0.11 | 0.85 | -0.05 | 0.06 | -0.04 | 0.07 | 0.05 | 0.15 | 0.02 |
| gorgeous-simple | 0.08 | 0.11 | 0.76 | 0.11 | -0.03 | 0.14 | 0.09 | -0.12 | 0.01 | 0.02 |
| luxurious-plain | 0.11 | 0.22 | 0.71 | 0.11 | -0.02 | 0.14 | 0.11 | -0.10 | -0.06 | 0.05 |
| curved-linear | 0.08 | 0.09 | 0.12 | 0.69 | 0.05 | -0.21 | 0.13 | 0.06 | -0.03 | -0.13 |
| lovely-not lovely | 0.17 | 0.19 | -0.10 | 0.62 | 0.17 | 0.24 | -0.08 | 0.12 | 0.04 | 0.13 |
| light-dark | 0.18 | -0.18 | -0.03 | 0.23 | 0.80 | -0.06 | -0.04 | 0.06 | 0.07 | 0.07 |
| white-black | 0.18 | -0.09 | 0.03 | 0.14 | 0.75 | 0.16 | 0.01 | -0.07 | 0.00 | 0.02 |
| cheerful-cheerless | 0.18 | 0.44 | 0.00 | 0.11 | 0.07 | 0.63 | 0.13 | -0.05 | 0.16 | -0.11 |
| bright-gloomy | 0.22 | 0.16 | -0.06 | -0.02 | 0.31 | 0.58 | 0.06 | -0.35 | 0.07 | -0.16 |
| complex-simple | 0.15 | 0.24 | 0.32 | 0.02 | 0.01 | 0.07 | 0.59 | -0.05 | 0.00 | -0.11 |
| professional-amateur | 0.12 | -0.16 | 0.03 | -0.07 | -0.01 | -0.09 | 0.03 | 0.62 | 0.00 | -0.05 |
| extensive-cramped | 0.45 | 0.00 | 0.40 | -0.03 | 0.03 | 0.06 | 0.00 | -0.07 | 0.60 | 0.09 |
| smooth-rough | 0.37 | -0.04 | 0.09 | 0.01 | 0.09 | -0.03 | -0.02 | -0.03 | 0.00 | 0.62 |

FIG. 9

| ITEM | METER | | | | | DOOR | | | CENTER CLUSTER | |
|---|---|---|---|---|---|---|---|---|---|---|
| DESIGN ELEMENT | A | B | C | D | E | J | K | L | M |
| 1ST FACTOR (AESTHETIC) | 0.12 | -0.02 | *0.44 | 0.05 | -0.26 | *0.11 | -0.09 | -0.12 | *0.10 |
| 2ND FACTOR (DYNAMIC) | 0.16 | -0.42 | -0.39 | *0.28 | 0.15 | -0.37 | *0.09 | *0.47 | -0.06 |
| 3RD FACTOR (HIGH GRADE) | -0.02 | -0.21 | -0.01 | 0.29 | *0.41 | *0.18 | 0.06 | -0.28 | *0.36 |
| • • • | • • • | • • • | • • • | • • • | • • • | • • • | • • • | • • • | • • • |
| KTH FACTOR | *0.52 | -0.24 | 0.14 | -0.32 | 0.14 | -0.24 | *0.31 | *0.31 | -0.14 |

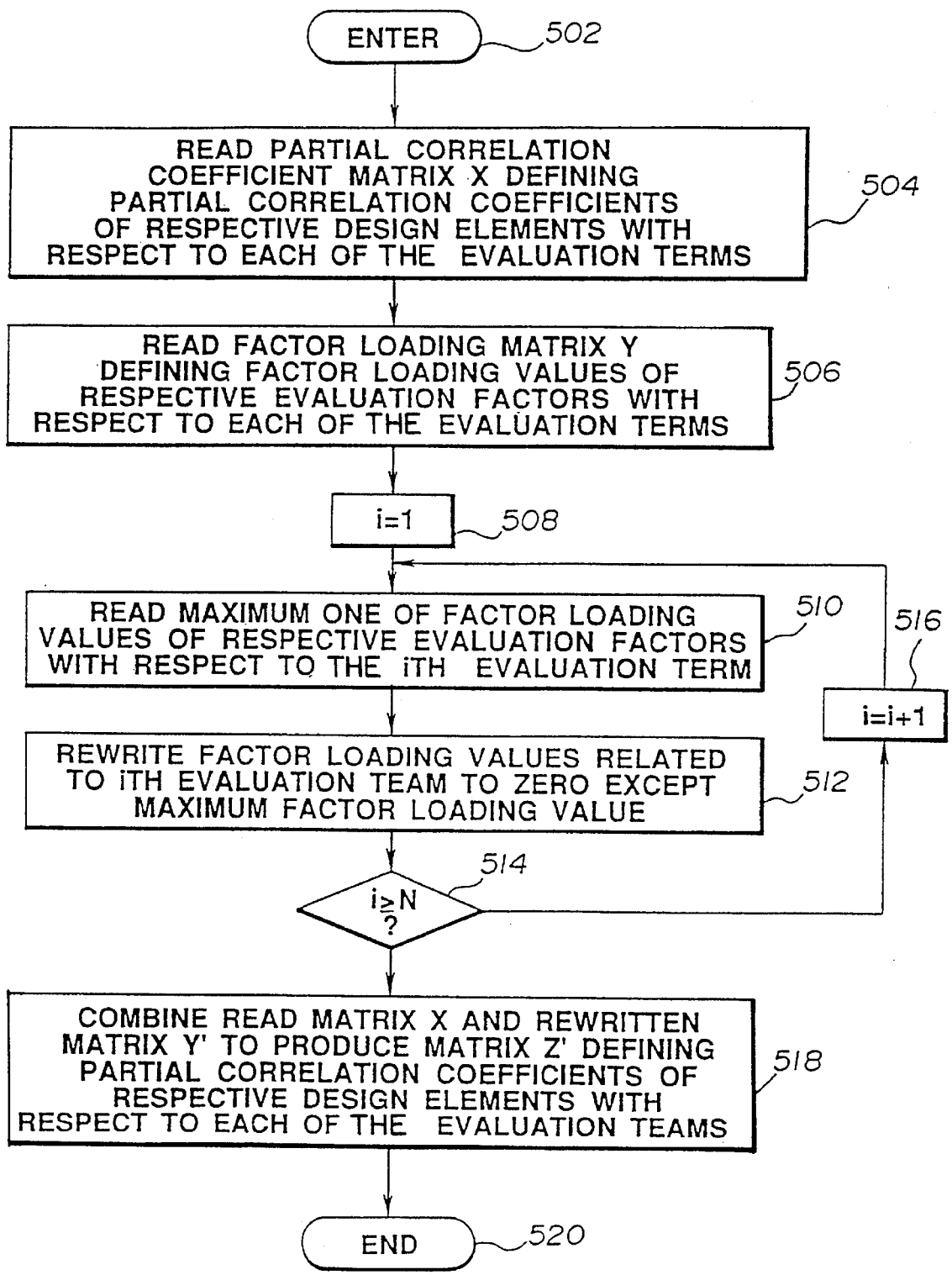

FIG. 11

| Evaluation term | Factor 1 | Factor 2 | Factor 3 | Factor 4 | Factor 5 | Factor 6 | Factor 7 | • • • • | FACTOR K |
|---|---|---|---|---|---|---|---|---|---|
| favorable-unfavorable | 0.99 | 0.00 | 0.00 | 0.00 | 0.00 | 0.00 | 0.00 | • • • • | 0.00 |
| comfortable-uncomfortable | 0.92 | 0.00 | 0.00 | 0.00 | 0.00 | 0.00 | 0.00 | | 0.00 |
| coherent-incoherent | 0.85 | 0.00 | 0.00 | 0.00 | 0.00 | 0.00 | 0.00 | • • • • | 0.00 |
| good design-bad design | 0.83 | 0.89 | 0.00 | 0.00 | 0.00 | 0.00 | 0.00 | | 0.00 |
| sporty-not sporty | 0.00 | 0.80 | 0.00 | 0.00 | 0.00 | 0.00 | 0.00 | • • • • | 0.00 |
| (for speed mania)-for all | 0.00 | 0.70 | 0.00 | 0.00 | 0.00 | 0.00 | 0.00 | | 0.00 |
| active-not active | 0.00 | 0.00 | 0.85 | 0.00 | 0.00 | 0.00 | 0.00 | • • • • | 0.00 |
| high grade-popular | 0.00 | 0.00 | 0.76 | 0.00 | 0.00 | 0.00 | 0.00 | | 0.00 |
| gorgeous-simple | 0.00 | 0.71 | 0.00 | 0.69 | 0.00 | 0.00 | 0.00 | • • • • | 0.00 |
| luxurious-plain | 0.00 | 0.00 | 0.00 | 0.62 | 0.00 | 0.00 | 0.00 | | 0.00 |
| curved-linear | 0.00 | 0.00 | 0.00 | 0.00 | 0.80 | 0.00 | 0.00 | • • • • | 0.00 |
| lovely-not lovely | 0.00 | 0.00 | 0.00 | 0.00 | 0.75 | 0.00 | 0.00 | | 0.00 |
| light-dark | 0.00 | 0.00 | 0.00 | 0.00 | 0.00 | 0.63 | 0.00 | • • • • | 0.00 |
| white-black | 0.00 | 0.00 | 0.00 | 0.00 | 0.00 | 0.58 | 0.00 | | 0.00 |
| cheerful-cheerless | 0.00 | 0.00 | 0.00 | 0.00 | 0.00 | 0.00 | 0.59 | • • • • | 0.00 |
| bright-gloomy | 0.00 | 0.00 | 0.00 | 0.00 | 0.00 | 0.00 | 0.00 | | 0.00 |
| complex-simple | 0.00 | 0.00 | 0.00 | 0.00 | 0.00 | 0.00 | 0.00 | • • • • | 0.00 |
| professional-amateur | 0.00 | 0.00 | 0.00 | 0.00 | 0.00 | 0.00 | 0.00 | | 0.00 |
| extensive-cramped | 0.00 | 0.00 | 0.00 | 0.00 | 0.00 | 0.00 | 0.00 | • • • • | 0.00 |
| smooth-rough | 0.00 | 0.00 | 0.00 | 0.00 | 0.00 | 0.00 | 0.00 | | 0.62 |

FIG.14A

| DESIGN SAMPLE | ITEM 1 | | | ITEM 2 | | ITEM 3 | | • • • • | ITEM K | |
|---|---|---|---|---|---|---|---|---|---|---|
| | A | B | C | F | G | H | I | | L | M |
| SAMPLE 1 | ○ | | | | ○ | | ○ | | | ○ |
| SAMPLE 2 | | | ○ | ○ | | | ○ | • • • • | ○ | |
| SAMPLE 3 | | ○ | | ○ | | ○ | | | | ○ |
| SAMPLE 4 | ○ | | | ○ | | ○ | | • • • • | ○ | |
| SAMPLE 5 | | | ○ | ○ | | | ○ | | ○ | |
| ⋮ | ⋮ | ⋮ | ⋮ | ⋮ | ⋮ | ⋮ | ⋮ | • • • • | ⋮ | |
| SAMPLE N | | ○ | | ○ | | ○ | | • • • • | ○ | |

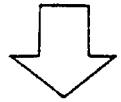

FIG.14B

| DESIGN SAMPLE | FACTOR SCORE | | | | | |
|---|---|---|---|---|---|---|
| | FACTOR 1 | FACTOR 2 | FACTOR 3 | FACTOR 4 | • • • | FACTOR K |
| SAMPLE 1 | 0.95 | 0.31 | 0.16 | 0.20 | | 0.05 |
| SAMPLE 2 | 0.88 | 0.11 | 0.32 | 0.16 | • • • | 0.21 |
| SAMPLE 3 | 0.85 | -0.08 | 0.14 | -0.22 | | 0.11 |
| SAMPLE 4 | 0.79 | 0.28 | 0.06 | 0.03 | • • • | 0.06 |
| SAMPLE 5 | 0.20 | 0.92 | -0.22 | -0.17 | | 0.08 |
| ⋮ | ⋮ | ⋮ | ⋮ | ⋮ | • • • | ⋮ |
| SAMPLE N | 0.37 | -0.09 | 0.09 | 0.01 | • • • | -0.03 |

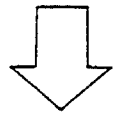

FIG.14C

| DESIGN SAMPLE | FACTOR SCORES OF 1ST FACTOR | ITEM 1 | | | ITEM 2 | | • • • • | ITEM K | |
|---|---|---|---|---|---|---|---|---|---|
| | | A | B | C | F | G | | L | M |
| SAMPLE 1 | 0.16 | ○ | | | | ○ | | | ○ |
| SAMPLE 2 | 0.32 | | | ○ | ○ | | • • • • | ○ | |
| SAMPLE 3 | 0.14 | | ○ | | ○ | | | | ○ |
| SAMPLE 4 | 0.06 | ○ | | | ○ | | • • • • | ○ | |
| SAMPLE 5 | -0.22 | | | ○ | ○ | | | ○ | |
| ⋮ | ⋮ | ⋮ | ⋮ | ⋮ | ⋮ | ⋮ | • • • • | | |
| SAMPLE N | 0.09 | | ○ | | ○ | | • • • • | ○ | |

APPARATUS FOR SELECTING AND EVALUATING DESIGN BASED ON STORED INFORMATION

This application is a continuation of application Ser. No. 07/627,283, filed Dec. 13, 1990, now abandoned.

BACKGROUND OF THE INVENTION

This invention relates to a design evaluation apparatus for evaluating a design composed of a plurality of design elements.

In the Society of Electronic Information Communication Journal, Vol. 71, No. 3, Mar. 1988, pp. 245–247, there is described a human living system for use in planning housing space including entrances, Western-style rooms, Japanese-style rooms, kitchens, bathrooms, etc. This human living system has a database stored in a computer memory. The database contains a various plans for each space of the house, evaluation terms, and a relationship specifying the plans in relation to the evaluation terms. The human living system employs the database to display an appropriate house space plan when an operator inputs an evaluation term, such as "extensive" along with a house space name, such as "Japanese-style room", through a keyboard into the system.

With such a human living system, it is impossible to evaluate a house space plan made by a designer.

SUMMARY OF THE INVENTION

Therefore, it is a main object of the invention to provide a design evaluation apparatus which can give an appropriate evaluation for various designers'plans inputted into the apparatus.

There is provided, in accordance with the invention, a design evaluation apparatus for evaluating a design composed of a plurality of design elements. The apparatus comprises first means for storing a database containing design elements, evaluation terms and a table defining relations of the respective design elements with respect to each of the evaluation terms, second means for selecting at least one of the evaluation terms representative of the design from the table based upon the design elements of the design, and third means for producing an evaluation result based upon the selected evaluation term.

In one aspect of the invention, the second means includes means responsive to an operator's instructions for selecting design elements from the database in a time sequence to produce a design.

In another aspect of the invention, the second means includes means for inputting a design, means for dividing the inputted design into design element, and means for selecting design elements similar to the respective design elements of the inputted design from the database.

BRIEF DESCRIPTION OF THE DRAWINGS

This invention will be described in greater detail by reference to the following description taken in connection with the accompanying drawings, in which:

FIG. 2 shows one example of correlation coefficient matrix table specifying correlation coefficients of respective design elements with respect to each of evaluation terms;

FIG. 5 shows one example of factor loading matrix table specifying factor loading values of respective evaluation factors with respect to each of the evaluation terms;

FIG. 9 shows one example of second correlation coefficient matrix table specifying correlation coefficients of respective design elements with respect to each of evaluation factors;

FIG. 10 is a flow diagram illustrating the programming of the digital computer as it is used to produce a modified form of the second correlation coefficient matrix table;

FIG. 11 shows a factor loading matrix table used in explaining the flow diagram of FIG. 10;

FIGS. 14A, 14B and 14C show tables explaining the flow diagram of FIG. 13.

DETAILED DESCRIPTION OF THE INVENTION

Figure 1:
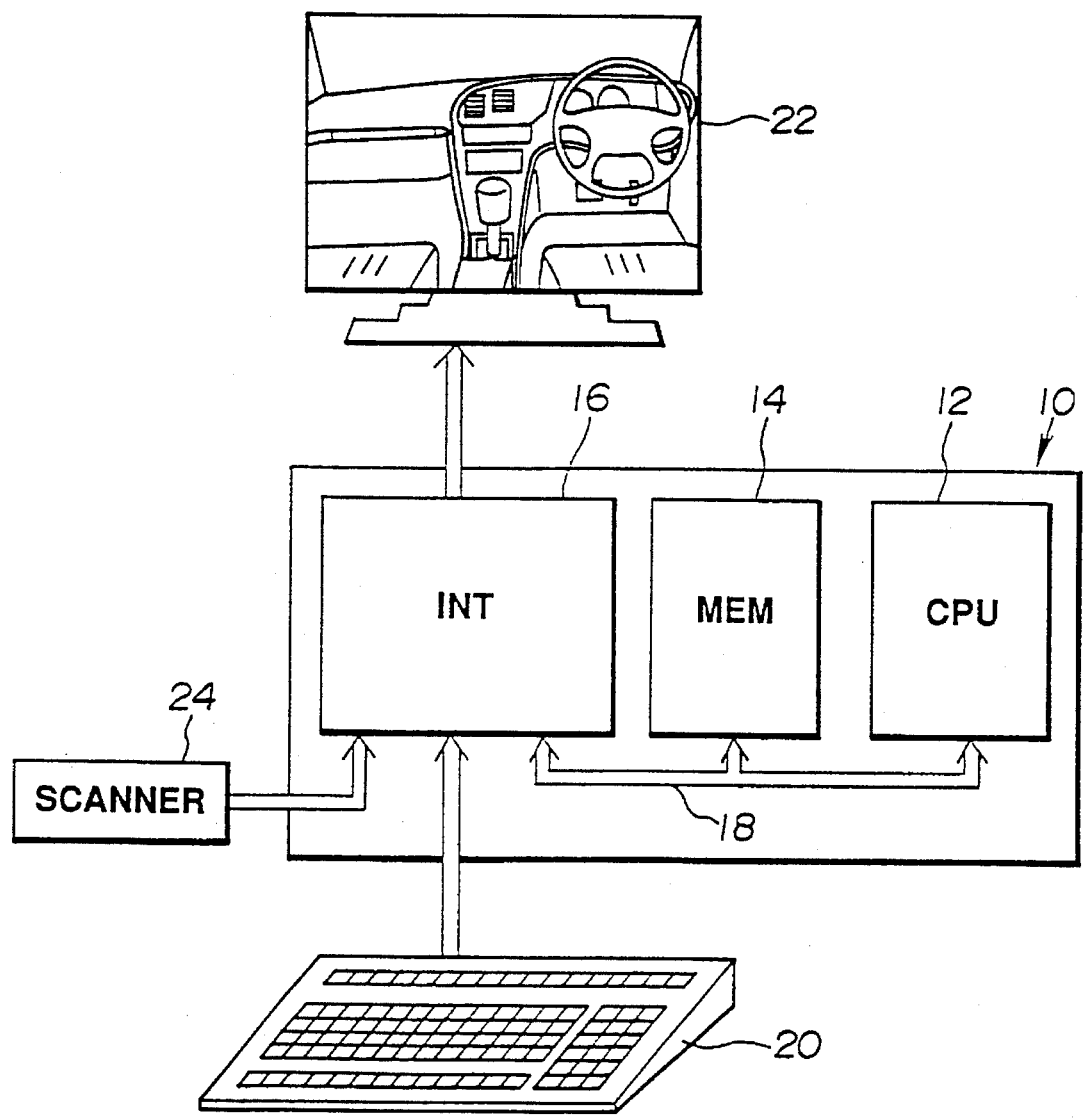
FIG. 1 is a schematic diagram of a design evaluation apparatus embodying the invention.

With reference to the drawings, and in particular to FIG. 1, there is shown a schematic diagram of a design evaluation apparatus embodying the invention. While the design evaluation apparatus will be described in connection with vehicle interior designs, it is to be understood that the design evaluation apparatus of the invention is also equally applicable for vehicle exterior designs, house interior designs, house exterior designs and other designs.

The design evaluation apparatus employs a digital computer 10 for evaluating a design composed of a plurality of design elements. The digital computer 10 includes a central processing unit (CPU) 12, a computer memory (MEM)14, an interface control unit (INT) 16 for communication with a keyboad 20 and a cathode ray tube (CRT) display 22. The central processing unit 12 communicates with the rest of the computer via data bus 18. The computer memory 14 contains the programs for operating the central processing unit 12 and further contains a database including evaluation terms (adjectives), design elements, a correlation coefficient matrix table, and other data used in evaluating a design inputted into the digital computer. The correlation coefficient matrix table defines correlation coefficients of the respective design elements with respect to each of the evaluation terms. The digital computer 10 selects at least one of the evaluation term representative of the design from the correlation coefficient matrix table based upon the design elements of the design to be evaluated. The digital computer 10 uses the selected evaluation term to produce an evaluation result which is displayed on the CRT display 22. The database may include evaluation factors and a factor loading matrix table which defines factor loading values of the respective evaluation factors with respect to each of the evaluation terms. The factor loading matrix table is used to find an evaluation factor representing the selected evaluation term.

Referring to FIG. 2, there is shown one example of the correlation coefficient matrix table included in the database stored in the computer memory 14. As can be seen from FIG. 2, a plurality of different design elements are prepared for each of items including "Meter", "Instrument Panel & Meter Cluster", "Meter Cluster & Center Console", "Door", "Center Cluster", etc. Five different design elements A, B, C, D and E are prepared for the item "Meter". The design element A includes one large meter. The design element B includes one large meter and two small meters. The design element C includes one large meter and three small meter. The design element D includes two large meters and one small meter. The design element E includes two large meters and two small meters. Similarly, two different design elements F and G are prepared for the item "Instrument Panel & Meter Cluster". The design element F includes a meter cluster united with an instrument panel and the second design element F includes a meter cluster separated from the instrument panel. Two different design elements H and I are prepared for the item "Meter Cluster & Center Console". The design element H includes a meter cluster united with a center console and the design element I includes a meter cluster separated from a center console. Two different design elements J and K are prepared for the item "Door". The design element J includes a door having a large thickness and the design element K includes a door having a small thickness. Likewise, two different design elements L and M are prepared for the item "Center Cluster". The design element L includes a center cluster having a projection and the design element M includes a center cluster having no projection.

The shown correlation coefficient matrix table is a partial correlation coefficient matrix table specifying partial correlation coefficients of the respective design elements with respect to each of the evaluation terms. The partial correlation coefficient matrix table is obtained through a series of well-known and commonly-used sensory evaluation tests. The sensory evaluation tests may include exhibiting a design element to many and unspecified persons, correcting evaluation terms corresponding to the impressions of the design element on the persons, and analyzing the corrected evaluation terms, through a multivariate analysis technique including a quantification method I, a quantification method II or the like. These tests are repeated for all of the design elements. The partial correlation coefficient matrix table is shown in the form of a matrix of numerals arranged in a number of rows and columns. The numerals arranged in a column indicate partial correlation coefficients of the respective evaluation term with respect to a design element. The numerals arranged in a row indicate partial correlation coefficients of an evaluation term with respect to the respective design elements. The greater the partial correlation coefficient of an evaluation term with respect to a design element, the closer the impression of the design element on many and unspecified persons to the evaluation term.

It is to be understood that the correlation coefficient matrix table may be replaced with a covariance matrix table or the like which defines relations of the respective design elements with respect to each of the evaluation terms.

Figure 3:
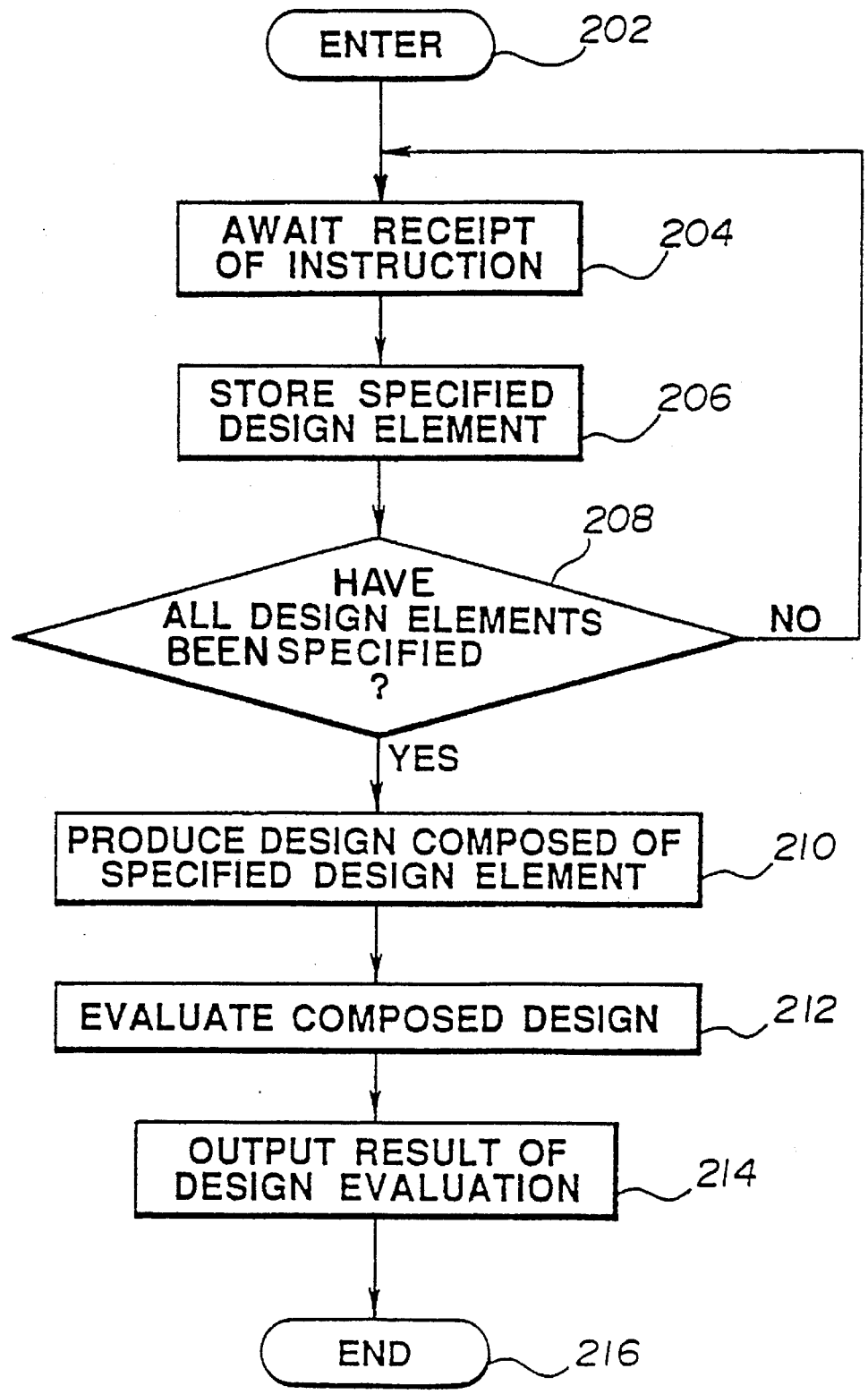
FIG. 3 is a flow diagram illustrating the programming of the digital computer as it is used to evaluate a composed vehicle interior design.

FIG. 3 is a flow diagram of the programming of the digital computer as it is used to evaluate a vehicle interior design. The computer program is entered at the point 202. At the point 204 in the program, the digital computer 10 awaits the receipt of an operator's instruction specifying one of design elements provided for each of the items. The operator's instruction is inputted to the digital computer 10 through the keyboard 20. This operation may be made in a conversational mode where the operator inputs an instruction specifying an item to the digital computer 10 which thereby displays all of the design elements provided for the specified item, and he (she) inputs an instruction to select one of the displayed design elements. After the receipt of this operator's instruction, at the point 206, the specified design element is stored into the computer memory 14.

At the point 208 in the program, a determination is made as to whether or not all of the design elements for the respective items required to form the the vehicle interior design to be evaluated are specified. If the answer to this question is "yes", then the program proceeds to the point 210. Otherwise, the program returns to the point 204 to await receipt of the next operator's instruction. Therefore, the above sequence of steps are repeated until all of the design elements required to form the vehicle interior design are specified. At the point 210 in the program, the digital computer 10 produces a vehicle interior design from the specified design elements and displays it on the CRT display 22.

At the point 212 in the program, the digital computer 10 employs the partial correlation coefficient matrix table (FIG. 2) stored in the computer memory 14 to evaluate the composed vehicle interior design. In FIG. 2, the enclosed numerals indicates the partial correlation coefficients for the specified design elements. For this purpose, the digital computer 10 calculates the sum of the enclosed numerals (partial correlation coefficients) related to each of the evaluation terms. This calculation is made for all of the evaluation terms. The calculated sums are indicated on the rightmost column of the partial correlation coefficient table of FIG. 2. The greater the sum, the closer the impression of the vehicle interior design on many and unspecified persons to the related evaluation term. Thus, the evaluation term related to one of the calculated sum having a maximum value is most representative of the composed vehicle interior design. In the illustrated case, the composed vehicle interior design will give an impression represented first by an evaluation term "for speed mania" and second by an evaluation term "bright".

Figure 4:
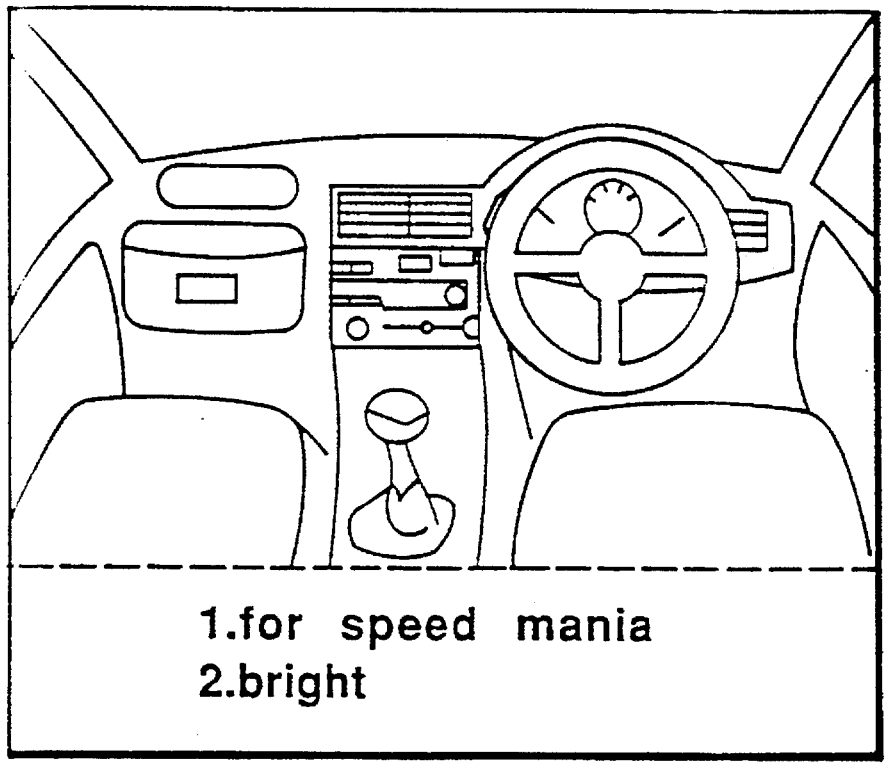
FIG. 4 is a diagram showing a composed vehicle interior design displayed on the CRT display along with selected evaluation terms.

At the point 214 in the program, the result of evaluation of the design is outputted on the CRT display 22, as shown in FIG. 4. It is preferable to display two or three evaluation terms related to sums having greater values. Following this, the program proceeds to the end point 216.

It is, therefore, possible for the operator to ascertain what impression the composed vehicle interior design will make on many and unspecified persons and modify the composed vehicle interior design to give a desired impression on many and unspecified persons if the obtained evaluation result is not close to his intention.

Referring to FIG. 5, there is shown one example of the factor loading matrix table stored in the computer memory for use in finding an evaluation factor representing the selected evaluation term. The use of this factor loading matrix table is effective to increase the number of available evaluation terms. The factor loading matrix table is obtained through well-known factor analysis, and is shown in the form of a matrix of numerals arranged in a number of rows and columns. The numerals arranged in a column indicate the factor loading values of the respective evaluation terms with respect to an evaluation factor. The numerals arranged in a row indicates the factor loading values of an evaluation term with respect to the respective evaluation factors. The similar evaluation terms have similar factor loading values with respect to the same evaluation factor. The greater the absolute value of the factor loading value of the evaluation term with respect to an evaluation factor, the closer the relation of the evaluation factor to the evaluation term.

For example, when the evaluation term "for speed mania" is selected from the partial correlation coefficient matrix table of FIG. 2, evaluation factor 2 (dynamic factor) is selected from the factor loading matrix table of FIG. 5. In this case, a term "dynamic" is outputted on the CRT display 22. Similarly, evaluation factor 1 is selected from the factor loading matrix table when the evaluation term "coherent" is selected from the partial correlation coefficient matrix table. Evaluation factor 3 is selected from the factor loading matrix table when the evaluation term "gorgeous" is selected from the partial correlation coefficient matrix table. Likewise, evaluation factor 9 is selected from the factor loading matrix table when the evaluation term "extensive" is selected from the partial correlation coefficient matrix table.

It is to be understood that the technique to obtain the factor loading matrix table is not limited in any way to the factor analysis.

Figure 6:
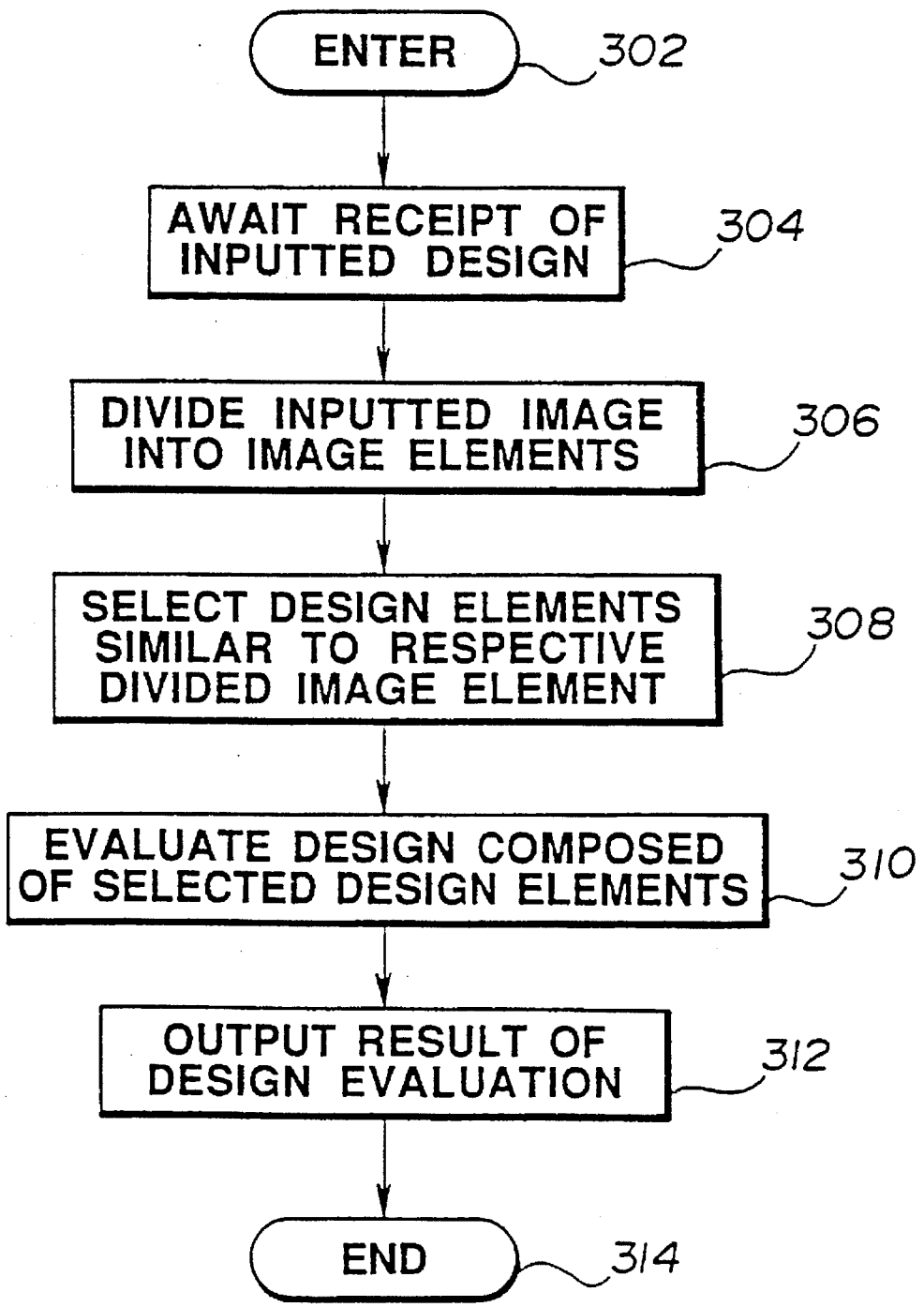
FIG. 6 is a flow diagram illustrating a modified form of the programming of the digital computer as it is used to evaluate a vehicle interior design inputted through a scanner.

FIG. 6 is a flow diagram illustrating the programming of the digital computer as it is used to evaluate a vehicle interior design read or inputted through a scanner. The scanner 24 is used to input a document having a design drawn thereon to the digital computer 10. The scanner 24 is conventional and may, for example, be a raster scanner having a digitizer.

The computer program is entered at the point 302. At the point 304 in the program, the digital computer 10 awaits the receipt of a scanned design image from the scanner 24. After the receipt of this scanned design image, at the point 306, the digital computer 10 divides the inputted design into design elements by a conventional image analysis technique. At the point 308 in the program, the digital computer 10 selects design elements similar to the respective design elements of the inputted design from the database.

At the point 310 in the program, the digital computer evaluates the inputted design with the use of the partial correlation coefficient matrix table (FIG. 2) substantially in the same manner as described in connection with the step at the point 212 of the computer program of FIG. 3. That is, the digital computer 10 makes this evaluation by reading partial correlation coefficients of the respective design elements selected from the database with respect to each of the evaluation terms, calculating the sum of the read partial correlation coefficients related to each of the evaluation terms, reading one of the calculated sums having a maximum value, and selecting an evaluation term related to the read sum. The selected evaluation term are used to produce an evaluation result. It is preferable to select two or three evaluation terms related to sums having greater values.

At the point 312 in the program, the result of evaluation of the inputted vehicle interior design is outputted on the CRT display 22 along with a vehicle interior design composed of the selected design elements, as shown in FIG. 4. Following this, the program proceeds to the end point 314.

It is, therefore, possible for the operator to ascertain what impression the inputted vehicle interior design will make on many and unspecified persons and modify the vehicle interior design to give a desired impression on many and unspecified persons if the displayed design evaluation result is not close to his intention.

Figure 7A:
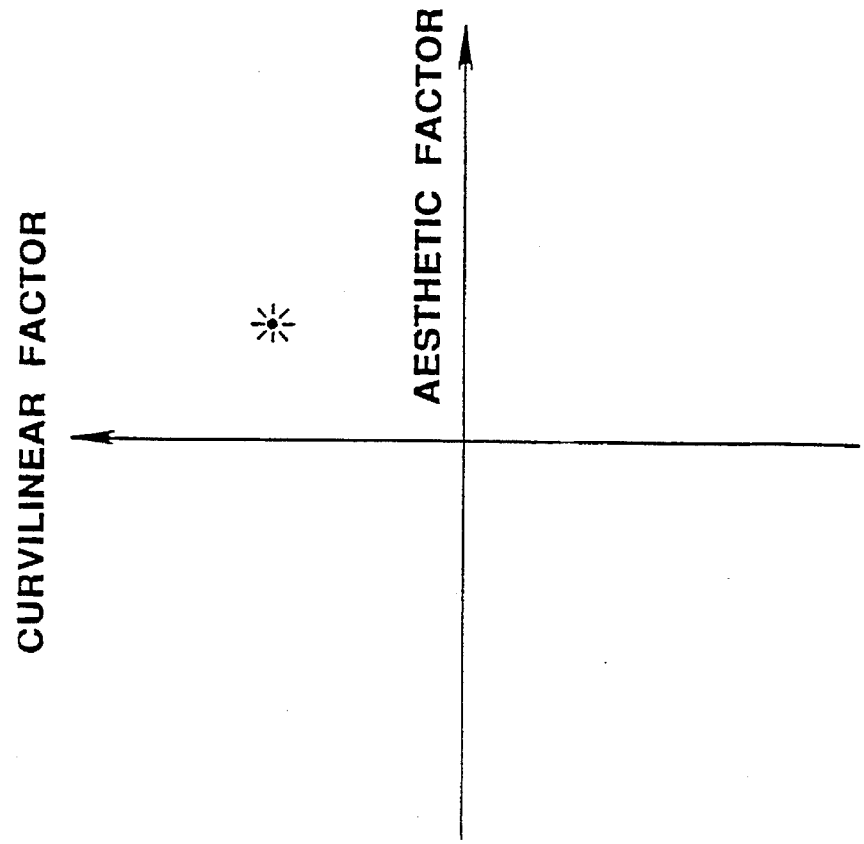
FIGS. 7A and 7B are diagrams illustrating another manner in which the evaluation result is displayed in relation to selected evaluation factors.
Figure 7B:
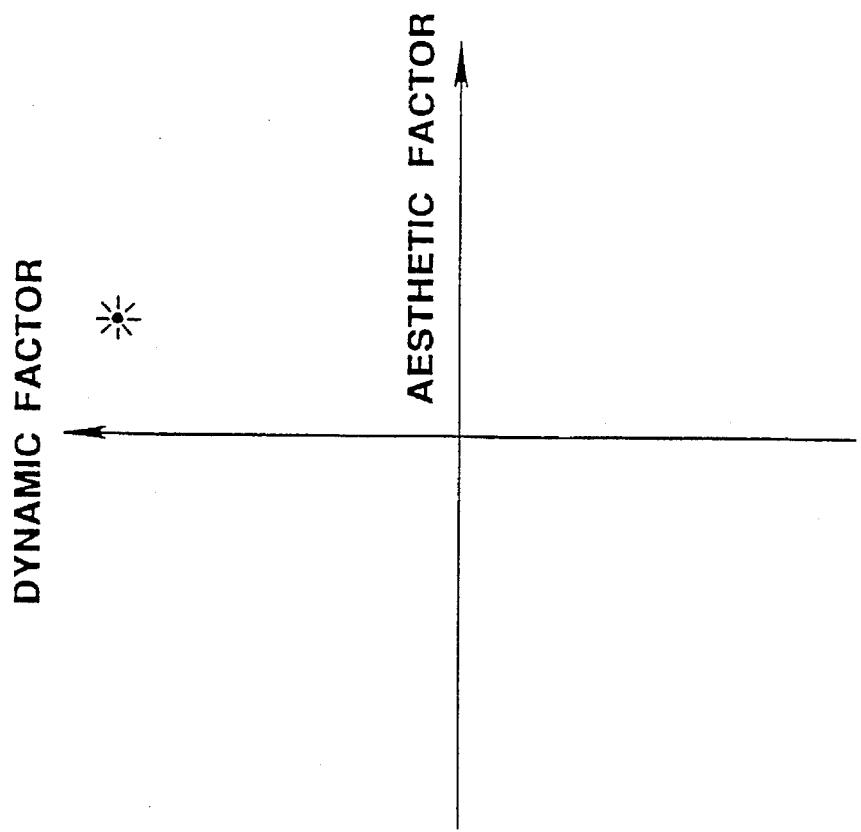

FIGS. 7A and 7B show a modified form of the manner in which the design evaluation result is displayed on the CRT display 22. In this modification, the design evaluation result is indicated as a point positioned in an orthogonal coordinate system having axes representing different evaluation factors (in the illustrated case dynamic factor, aesthetic factor and curvilinear factor). The evaluation factor for each axis can be selected through the operation of the keyboard 20.

Figure 8:
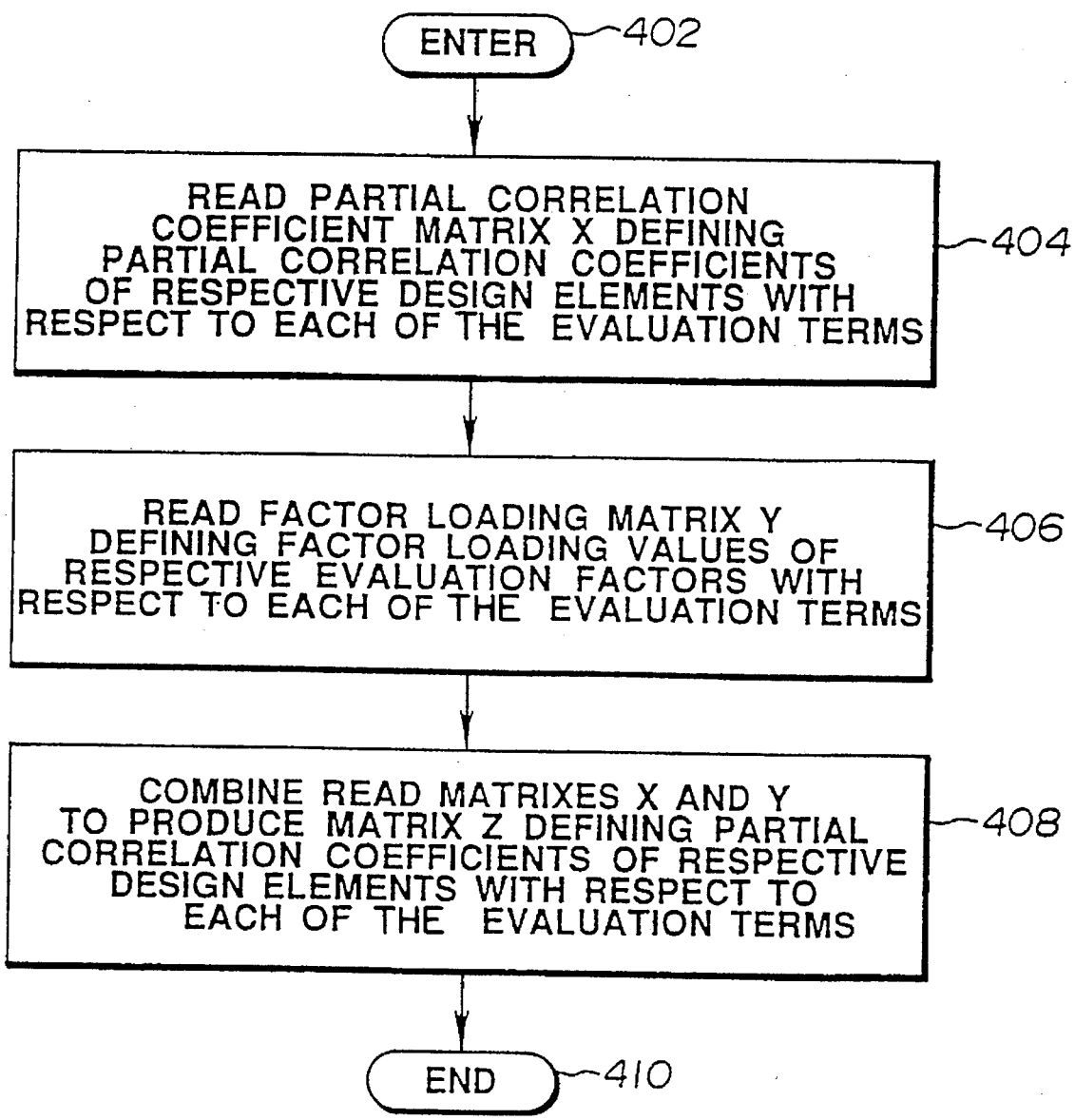
FIG. 8 is a flow diagram illustrating the programming of the digital computer as it is used to combine the correlation coefficient matrix table and the factor loading matrix table, to produce a second correlation coefficient matrix table.

FIG. 8 is a flow diagram illustrating the programming of the digital computer as it is used to produce a matrix table defining correlation coefficients of the respective design elements with respect to each of the evaluation factors.

The computer program is entered at the point 402. At the point 404 in the program, the partial correlation coefficient matrix table is read into the computer memory 14. The partial correlation coefficient matrix (FIG. 2) is represented as $X = \{x_{ij}\}$ where $x_{ij}$ is the partial correlation coefficient of the ith design element with respect to the jth evaluation term.

At the point 406 in the program, the factor loading matrix table is read into the computer memory 14. The factor loading matrix (FIG. 5) is represented as $Y = \{y_{ij}\}$ where $y_{ij}$ is the factor loading value of the ith evaluation factor with respect to the jth evaluation term.

At the point 408 in the program, the read partial correlation coefficient matrix X and the read factor loading matrix Y are combined to produce a partial correlation coefficient matrix $Z = \{z_{ij}\}$ where $z_{ij}$ is the partial correlation coefficient of the ith design element with respect to the jth evaluation factor. The resulting partial correlation coefficient matrix Z is shown in FIG. 9. The digital computer 10 makes this combination by weighting all of the partial correlation coefficients according to the factor loading values of the corresponding evaluation factors. Thus, $Z = (Y^T) \cdot X$.

Following this, the program proceeds to the end point 410.

FIG. 10 is a flow diagram illustrating the programming of the digital computer as it is used to produce another form of the matrix Z.

The computer program is entered at the point 502. At the point 504 in the program, the partial correlation coefficient matrix $X = \{x_{ij}\}$ is read into the computer memory 14. At the point 506 in the program, the factor loading matrix $Y = \{y_{ij}\}$ is read into the computer memory 14.

Following this, the factor loading matrix Y (FIG. 5) is rewritten. For this purpose, at the point 508, the ordinal number i is set at 1. At the point 510 in the program, the maximum one of the factor loading values of the respective evaluation factors with respect to the ith evaluation term is found. At the point 512 in the program, the factor loading values of the respective evaluation factors with respect to the ith evaluation term are rewritten to zero except for the maximum factor loading value. For example, if the ordinal number i is 1, the maximum factor loading value (0.99) remains as it is and the other loading values (0.11, 0.06, 0.20, 0.77, 0.10, 0.05, 0.10, 0.03, 0.02) are rewritten to zero. At the point 514 in the program, a determination is made as to whether or not i is equal to or greater than a predetermined value N which is equal to the total number of the evaluation terms provided in the factor loading matrix Y (FIG. 5). If the answer to this question is "yes", then the program proceeds to the point 518. Otherwise, the program proceeds to the point 516 where the ordinal number i is incremented and then to the point 510. Therefore, the above sequence of the steps at the points 510–516 are repeated until the factor loading matrix Y is rewritten for all of the evaluation terms. The rewritten factor loading matrix Y'is shown in FIG. 11.

At the point 518 in the program, the read partial correlation coefficient matrix X and the rewritten factor loading matrix Y'are combined to produce a partial correlation coefficient matrix Z'. The digital computer 10 makes this combination by weighting all of the partial correlation coefficients according to the factor loading values of the corresponding evaluation factors substantially in the same manner as described in connection with the point 408 of the computer program of FIG. 8. Thus, $Z'=(Y'^T) \cdot x$.

Following this, the program proceeds to the end point 520.

Figure 12B:
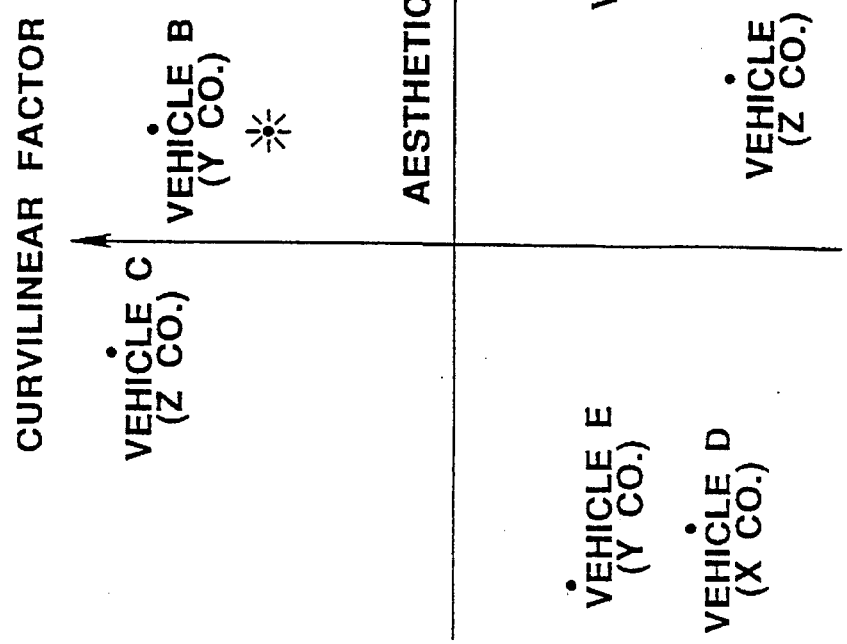
FIGS. 12A and 12B are diagrams illustrating still another manner in which the evaluation result is displayed in connection with other design samples.
Figure 12A:
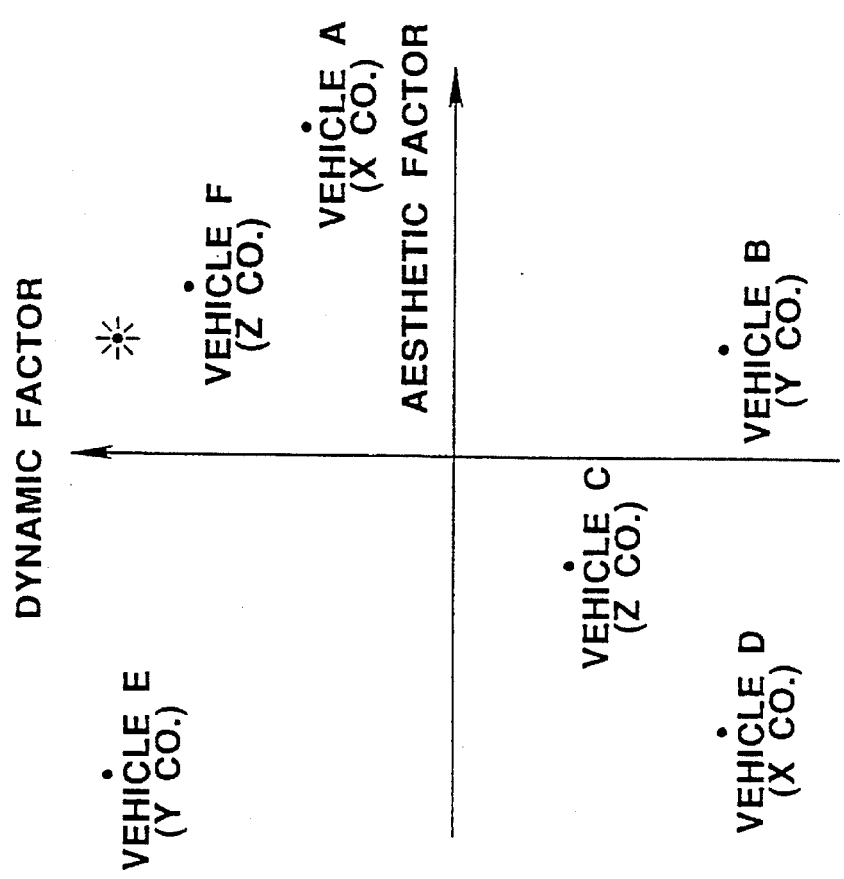

FIGS. 12A and 12B show still another modified form of the manner in which the design evaluation result is displayed on the CRT display 22. In this modification, the design evaluation result is indicated as a point positioned in an orthogonal coordinate system along with other vehicle interior design samples indicated by vehicle and manufacture names. This is effective to know which one of the vehicle interior designs is closest to the vehicle interior design inputted to the digital computer 10.

Figure 13:
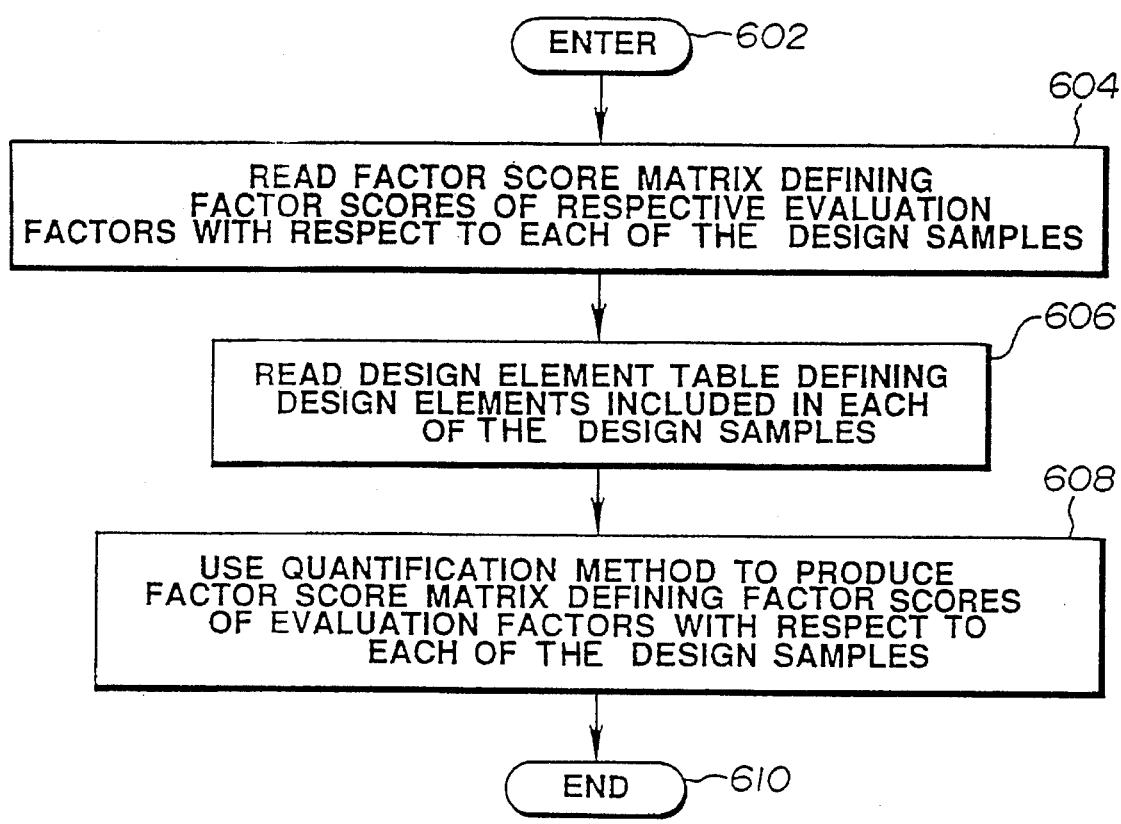
FIG. 13 is a flow diagram illustrating the programming of the digital computer to produce a factor score matrix.

FIG. 13 is a flow diagram illustrating the programming of the digital computer as it is used to produce a factor score matrix.

The computer program is entered at the point 602. At the point 604 in the program, a factor score matrix T is read into the computer memory 14. The factor score matrix T (FIG. 14B) defines factor scores of the respective evaluation factors with respect to each of the design samples and it is represented as T ={tij } where tij is the factor score of the ith evaluation term with respect to the jth design sample. The factor score matrix T is obtained through a conventional factor analysis technique.

At the point 606 in the program, a design element table is read into the computer memory. This table (FIG. 14A) specifies design elements included in each of the design samples. At the point 608 in the program, the digital computer 10 produces a factor score matrix (FIG. 14C) by applying a multivariate analysis technique including a quantification method I to quantifying the read data. The resulting factor score matrix, which defines factor scores of the respective evaluation factors with respect to each of the design samples, is used to display the design sample on the CRT display 22, as shogun in FIGS. 12A and 12B. Following this, the program proceeds to the end point 610.

What is claimed is:

1. An apparatus including a digital computer for evaluating a design including a plurality of items, the apparatus comprising:

a data bus;

a processing unit connected to said data bus;

a computer memory connected to said data bus;

a display unit.;

an interface control unit connected to said display unit and connected to said data bus;

input means connected to said interface control unit for inputting information derived from said design;

a database stored in said computer memory unit, wherein said database contains, for each of said plurality of items, a plurality of design elements, each design element having a plurality of variables correlating to a plurality of evaluation terms, respectively, wherein said processing unit identifies from said inputted information a design element for each of said plurality of items, said processing unit selects, for each of the plurality of said items, one of said plurality of design elements contained in said database which is substantially the same as said identified design element, to determine one variable out of said plurality of variables allocated to said selected design element, said processing unit calculates, for each of said plurality of evaluation terms, a sum of all of said determined variables correlating to each evaluation term, said processing unit selects at least one evaluation term out of said plurality of evaluation terms in response to an order of said calculated sums for said plurality of evaluation terms, and said display unit controlled by said interface control unit displays said selected evaluation term.

2. A system as recited in claim 1, further comprising:

a factor loading matrix table stored in said computer memory and configured to store factor loading values for each of said evaluation terms with respect to a plurality of evaluation factors, wherein said factor loading values range between 0 to 1, inclusive, and a higher factor loading value corresponds to a higher correlation between an evaluation term and an evaluation factor;

means for creating a weighted partial correlation coefficient table by weighting said variables in said database by said evaluation factors in said factor loading matrix table to produce weighted partial correlation coefficients for each of said evaluation factors with respect to each of said design elements, wherein said display unit is configured to display an x-y coordinate graph in which a first selected one of said evaluation factors corresponds to an x-axis of said x-y coordinate graph, and a second selected one of said evaluation factors corresponds to a y-axis of said x-y coordinate graph, wherein said first selected one and said second selected one of said evaluation factors are selected by operator inputs via said input means, and wherein a correlation of said design with respect to said first selected one of said evaluation factor and said second selected one of said evaluation factor is determined by a placement of a mark on said x-y coordinate graph by said processing unit.

3. A system as recited in claim 2, further comprising:

a factor score matrix table configured to store variables corresponding to a correlation of each evaluation factor with respect to each design evaluated by the system; and means for outputting a listing of an evaluation factor with a greatest amount of correlation for said each design.

4. A computer aided design method of evaluating a design including a plurality of items, the method comprising the steps of:

identifying, via an input unit connected to said computer, a design element for each of said plurality of items of the design;

storing a database in a memory of said computer, including, for each of said plurality of items, a plurality of design elements, each design element having a plurality of variables correlating to a plurality of evaluation terms, respectively;

selecting from said database, for each of the plurality of items, one of said plurality of design elements which is substantially the same as said identified design element to determine one variable, out of said plurality of variables, allocated to said selected design element, calculating, in said computer, for each of said plurality of evaluation terms, a sum of all of said determined variables correlating to each evaluation term;

selecting, in said computer, at least one evaluation term out of said plurality of evaluation terms in response to an order of said calculated sums for said plurality of evaluation terms; and outputting said selected evaluation term to an output device connected to said computer via an interface unit to display said selected evaluation term.

5. A method as claimed in claim 4, wherein each of said plurality of variables is a coefficient.

6. A Computer aided design method of evaluating a design including a plurality of items, the method comprising the steps of:

identifying, via an input unit connected to said computer, a design element for each of the plurality of items of the design;

storing a database in a memory of said computer, wherein said database contains, for each of the plurality of items, a plurality of design elements, each having a plurality of coefficients correlating to a plurality of evaluation terms, respectively;

selecting from said database stored in said memory, for each of the plurality of items, one of said plurality of design elements which is substantially the same as said identified design element, to determine one coefficient out of said plurality of coefficients, allocated to said selected design element, calculating, with said computer, for each of said plurality of evaluation terms, a sum of all of said determined coefficients correlating to each evaluation term and selecting one evaluation term out of said plurality of evaluation terms having the greatest sum among of said calculated sums for said plurality of evaluation terms; and outputting said selected evaluation term to a display unit connected to a computer via an interface control unit to display said selected evaluation term.

7. A computer-aided design evaluation system for evaluating a design which includes a plurality of design items, said system comprising:

a computer memory configured to store a plurality of design elements, a plurality of evaluation terms, and a correlation coefficient table, said correlation coefficient table storing partial correlation coefficients that link each of said design elements to each of said evaluation terms;

a display configured to display said plurality of design elements corresponding to each of a plurality of design items;

an input device configured to receive a selection of one of said plurality of design elements of said corresponding plurality of design elements for each of said plurality of design items as selected design elements;

a digital computer programmed to determine an amount of correlation of said selected design elements with respect to each of said evaluation terms stored in said computer memory;

said digital computer programmed to select one of said evaluation terms having a greatest amount of correlation with respect to said selected design elements; and said display configured to display said selected one of said evaluation terms as a subjective evaluation measure of said design.

8. A system as recited in claim 7, further comprising:

a factor loading matrix table stored in said computer memory and configured to store factor loading values for each of said evaluation terms with respect to a plurality of evaluation factors, wherein said factor loading values range between 0 to 1, inclusive, and a higher factor loading value corresponds to a higher correlation between an evaluation term and an evaluation factor;

means for creating a weighted partial correlation coefficient table by weighting said partial correlation coefficients in said correlation coefficient table by said evaluation factors in said factor loading matrix table to produce weighted partial correlation coefficients for each of said evaluation factors with respect to each of said design elements; and said display configured to display said weighted partial correlation coefficient table.

9. A system as recited in claim 7, further comprising:

scanning means for scanning a design image into said system; and image interpretation means for selecting design elements based on said scanned design image.

10. A system as recited in claim 7, wherein said greatest amount of correlation is determined in said selection circuit by summing the partial correlation coefficients for each of said evaluation terms related to the selected design elements, and wherein the selected one of said evaluation terms has a greatest positive sum of the partial correlation coefficients related to the selected design elements of all of said evaluation terms.

11. A system as recited in claim 8, further comprising:

means for updating said factor loading matrix table by determining the $i$ largest factor loading values for each evaluation term $j$, $i$ being an integer greater than 1, $j$ being an integer designating a number of evaluation terms in said factor loading matrix table, and for setting all other factor loading values for said each evaluation term $j$ to 0, wherein said creating means creates said weighted partial correlation coefficient table based on said updated factor loading matrix table.

12. A system as recited in claim 8, wherein said display is configured to display an x-y coordinate graph in which a first selected one of said evaluation factors corresponds to an x-axis of said x-y coordinate graph, and a second selected one of said evaluation factors corresponds to a y-axis of said x-y coordinate graph, wherein said first selected one and said second selected one of said evaluation factors are selected via said input device, and wherein a correlation of said design with respect to said first selected one of said evaluation factors and said second selected one of said evaluation factors is determined by a placement of a mark on said x-y coordinate graph by said digital computer.

13. A system as recited in claim 12, wherein said display is also configured to display a label associated with said design along with said x-y coordinate graph, and wherein said x-axis is labeled with said first selected one of said evaluation factors and said y-axis is labeled with said second selected one of said evaluation factors.

14. A system as recited in claim 8, further comprising:

a factor score matrix table configured to store variables corresponding to a correlation of each evaluation factor with respect to each design evaluated by the system; and means for outputting a listing of an evaluation factor with a greatest amount of correlation for said each design.

15. A computer-aided design evaluation system for evaluating an automobile design which includes a plurality of design items, said design items including a type of instrument panel for said automobile design, said system comprising:

a computer memory configured to store a plurality of design elements, a plurality of evaluation terms, and a correlation coefficient table, said correlation coefficient table storing partial correlation coefficients that link each of said design elements to each of said evaluation terms, said evaluation terms including a first plurality of terms corresponding to aesthetic characteristics of said automobile design and a second plurality of terms corresponding to performance characteristics of said automobile design;

a display configured to display said plurality of design elements corresponding to each of a plurality of design items;

an input device configured to receive a selection of one of said plurality of design elements of said corresponding plurality of design elements for each of said plurality of design items as selected design elements;

a digital computer programmed to determine an amount of correlation of said selected design elements with respect to each of said evaluation terms stored in said computer memory;

said digital computer programmed to select one of said evaluation terms having a greatest amount of correlation with respect to said selected design elements; and said display configured to display said selected one of said evaluation terms as a subjective evaluation measure of said design.

16. A system as recited in claim 15, further comprising:

a factor loading matrix table stored in said computer memory and configured to store factor loading values for each of said evaluation terms with respect to a plurality of evaluation factors, wherein said factor loading values range between 0 to 1, inclusive, and a higher factor loading value corresponds to a higher correlation between an evaluation term and an evaluation factor;

means for creating a weighted partial correlation coefficient table by weighting said partial correlation coefficients in said correlation coefficient table by said evaluation factors in said factor loading matrix table to produce weighted partial correlation coefficients for each of said evaluation factors with respect to each of said design elements; and said display configured to display said weighted partial correlation coefficient table.

17. A system as recited in claim 16, further comprising:

means for updating said factor loading matrix table by determining the $i_j$ largest factor loading values for each evaluation term j, i being an integer greater than 1, j being an integer designating a number of evaluation terms in said factor loading matrix table, and for setting all other factor loading values for said each evaluation term j to 0, wherein said creating means creates said weighted partial correlation coefficient table based on said updated factor loading matrix table.

18. A system as recited in claim 17, wherein said display is configured to display an x-y coordinate graph in which a first selected one of said evaluation factors corresponds to an x-axis of said x-y coordinate graph, and a second selected one of said evaluation factors corresponds to a y-axis of said x-y coordinate graph, wherein said first selected one and said second selected one of said evaluation factors are selected via said input device, and wherein a correlation of said design with respect to said first selected one of said evaluation factors and said second selected one of said evaluation factors is determined by a placement of a mark on said x-y coordinate graph by said digital computer.

19. A system as recited in claim 17, wherein said display is also configured to display a label associated with said design along with said x-y coordinate graph, and wherein said x-axis is labeled with said first selected one of said evaluation factors and said y-axis is labeled with said second selected one of said evaluation factors.

* * * * *